(12) United States Patent
Chen et al.

(10) Patent No.: US 10,847,412 B2
(45) Date of Patent: Nov. 24, 2020

(54) INTERCONNECT STRUCTURE, INTERCONNECT LAYOUT STRUCTURE, AND MANUFACTURING METHOD THEREOF

(71) Applicant: UNITED MICROELECTRONICS CORP., Hsin-Chu (TW)

(72) Inventors: Tong-Yu Chen, Hsinchu (TW); Chia-Fang Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/354,157

(22) Filed: Mar. 14, 2019

(65) Prior Publication Data

US 2019/0214292 A1 Jul. 11, 2019

Related U.S. Application Data

(62) Division of application No. 15/007,212, filed on Jan. 27, 2016, now Pat. No. 10,276,429.

(30) Foreign Application Priority Data

Jan. 5, 2016 (CN) .......................... 2016 1 0004548

(51) Int. Cl.
*H01L 21/768* (2006.01)
*H01L 23/522* (2006.01)
(Continued)

(52) U.S. Cl.
CPC ...... *H01L 21/7682* (2013.01); *H01L 23/5222* (2013.01); *H01L 23/5226* (2013.01); *H01L 23/53295* (2013.01); *H01L 23/485* (2013.01)

(58) Field of Classification Search
CPC ............. H01L 21/7682; H01L 23/5222; H01L 23/53295; H01L 23/5226; H01L 23/485;
(Continued)

(56) References Cited

U.S. PATENT DOCUMENTS 6,764,919 B2 7/2004 Yu
6,888,247 B2 5/2005 Lee et al.
(Continued)

FOREIGN PATENT DOCUMENTS

CN 101399222 A 4/2009
CN 104126220 A 10/2014

OTHER PUBLICATIONS

Williams et al., Etch Rates for Micromachining Processing—Part II, Journal of MicroElectroMechanical Systems, vol. 12, No. 6, Dec. 2003, 2003 IEEE, cover page + p. 762-778.

*Primary Examiner* — Marcos D. Pizarro
*Assistant Examiner* — Sue Tang
(74) *Attorney, Agent, or Firm* — Winston Hsu

(57) ABSTRACT

A method for manufacturing an interconnect structure with air gaps includes the following steps. A substrate including a first insulating layer formed thereon is provided. Plural conductive lines are formed in the first insulating layer. A patterned hard mask is formed on the first insulating layer and the conductive lines and exposes portions of the first insulating layer and portions of the conductive lines. The exposed portions of the first insulating layer are then removed to form a plurality of recesses in the first insulating layer. After that, a second insulating layer and a third insulating layer are formed in the recesses to seal the recesses and to form a plurality of air gaps in the recesses. At least two air gaps are respectively formed at two sides of one conductive line of the plurality of conductive lines. A via structure is then formed on the one conductive line.

4 Claims, 10 Drawing Sheets

(51) Int. Cl.
*H01L 23/532* (2006.01)
*H01L 23/485* (2006.01)

(58) Field of Classification Search
CPC ............. H01L 23/535; H01L 21/76802; H01L 21/022; H01L 21/0228
See application file for complete search history.

(56) References Cited

U.S. PATENT DOCUMENTS

| | | |
|---|---|---|
| 6,984,577 B1 * | 1/2006 | Zhao ................. H01L 21/76802 |
| | | 257/E21.577 |
| 7,238,604 B2 | 7/2007 | Kloster et al. |
| 7,868,455 B2 | 1/2011 | Chen |
| 8,288,268 B2 | 10/2012 | Edelstein |
| 8,420,528 B2 * | 4/2013 | Noguchi ........... H01L 21/76811 |
| | | 438/627 |
| 2003/0205782 A1 | 11/2003 | Ireland |
| 2004/0121577 A1 | 6/2004 | Yu |
| 2007/0002602 A1 | 1/2007 | Akaogi |
| 2009/0093112 A1 * | 4/2009 | Al-Bayati ........... H01L 21/7682 |
| | | 438/618 |
| 2009/0191367 A1 | 7/2009 | Chen |
| 2012/0187566 A1 | 7/2012 | Horak |
| 2014/0339698 A1 | 11/2014 | Cassidy |
| 2015/0037980 A1 * | 2/2015 | Rha .................... H01L 23/5283 |
| | | 438/700 |
| 2015/0091186 A1 | 4/2015 | Yang |
| 2015/0137378 A1 * | 5/2015 | Wu .................... H01L 23/5222 |
| | | 257/773 |

* cited by examiner

INTERCONNECT STRUCTURE, INTERCONNECT LAYOUT STRUCTURE, AND MANUFACTURING METHOD THEREOF

CROSS REFERENCE TO RELATED APPLICATIONS

This application is a division of U.S. application Ser. No. 15/007,212 filed on Jan. 27, 2016, and incorporated herein by reference in its entirety.

BACKGROUND OF THE INVENTION

1. Field of the Invention

The present invention relates to an interconnect structure, an interconnect layout structure, and a manufacturing method thereof, and more particularly, to an interconnect structure with air gaps, an interconnect layout structure with air gaps and manufacturing method thereof.

2. Description of the Prior Art

As the semiconductor industry introduced new generations of integrated circuits (hereinafter abbreviated as ICs) having higher performance and more functionality, the density of elements forming the ICs is increased, while the size of the semiconductor devices and line width of the interconnect structures concurrently are reduced. Consequently, more issues are created because of such reductions. For example, when distance between two adjacent conductive lines is reduced, line resistance (R), and parasitic capacitance (C) are increased, and thus resistance-capacitance time delay (RC delay) is increased. RC delay unwantedly lowers IC computing speed and performance. Moreover, above-mentioned adverse impact from RC delay is increased when the line width of the ICs is smaller than 0.15 and/or 0.13 micrometer (μm).

Since RC delay is determined by the product of the line resistance and parasitic capacitance of the conductive line, as a countermeasure against to the problem, there has been proposed to use conductive materials with lower capacitance, or to lower the parasitic capacitance between the two conductive lines. Furthermore, since the parasitic capacitance is related to dielectric constant (k) of the insulating material between the two conductive lines, it can be reduced when the insulating material (s) having lower dielectric constant is adopted. Additionally, insulating material (s) having dielectric constant lower than 2.5-3.5, also known as low-k insulating material (s) not only reduces parasitic capacitance and RC delay, but also reduces power consumption. Consequently, adoption of low-k dielectric materials optimize performance of the interconnect structure in an ultra large scale integration (ULSI).

Furthermore, air is used as an insulating material between the conductive lines because dielectric constant of air is about 1. Additionally, air gap not only reduces RC delay, but also has advantage of low heat conductivity. Although the formation of air gaps reduces the parasitic capacitance, the conventional process suffers from other drawbacks. For example, air gap is not strong enough to support the conductive lines and thus reliability issue is generated. Furthermore, the formation of air gaps is a complicated processing and cannot be made in a mass production. Accordingly, a method for manufacturing the interconnect structure with air gaps is still in need.

SUMMARY OF THE INVENTION

According to an aspect of the present invention, a method for manufacturing an interconnect structure with air gaps is provided. The method for manufacturing the interconnect structure with air gaps includes following steps: A substrate including a first insulating layer formed thereon is provided. And a plurality of conductive lines are formed in the first insulating layer. Next, a patterned hard mask is formed on the first insulating layer and the conductive lines. The patterned hard mask exposes portions of the first insulating layer and portions of the conductive lines. Then, the exposed portions of the first insulating layer are removed to form a plurality of recesses in the first insulating layer and followed by forming a second insulating layer and a third insulating layer in the recesses to seal the recesses and to form a plurality of air gaps respectively in the recesses. At least two air gaps are respectively formed at two sides of one conductive line of the plurality of conductive lines. Then, a via structure is formed on the one conductive line.

According to an aspect of the present invention, an interconnect structure with air gap is provided. The interconnect structure with air gap includes a substrate including an insulating material disposed thereon, a conductive line disposed in the insulating material, at least an air gap disposed in the insulating material and immediately adjacent to the conductive line, a landing mark disposed on the conductive line, and a via structure formed on the landing mark. And the via structure is electrically connected to the conductive line.

According to an aspect of the present invention, an interconnect layout structure with air gaps is provided. The interconnect layout structure includes a plurality of air gaps extended along a direction, and at least a first interconnect unit disposed in between the air gaps. The first interconnect unit includes a first conductive line, a first landing mark disposed on the first conductive line, and a first via structure disposed on the first landing mark, the first via structure penetrating the first landing mark and being electrically connected to the first conductive line. The air gaps arranged in a straight line, or arranged in a same column, are physically separated from each other by the first landing mark.

According to the interconnect structure with air gaps, the interconnect layout structure with air gaps, and manufacturing method thereof provided by the present invention, at least an interconnect unit including the conductive line, the landing mark, and the via structure is provided. The interconnect unit is inserted into and arranged in the interconnect structure and/or the interconnect layout structure depending on different product requirements, and the landing mark of the interconnect unit physically separates the air gaps arranged in a straight line from each other. And the interconnect unit(s) inserted into the interconnect structure with air gaps and the interconnect layout structure with air gaps provides structural support. Consequently, the mechanical strength of the whole interconnect structure is improved. Furthermore, since the interconnect unit can be introduced into the interconnect structure at where it is required, the present invention further simplifies routing design for the interconnect structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-4B are schematic drawings illustrating a method for manufacturing an interconnect structure with air gaps provided by a first preferred embodiment of the present invention, wherein

FIG. 4B is a cross-sectional view taken along a line B-B' of FIG. 4A.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1A:
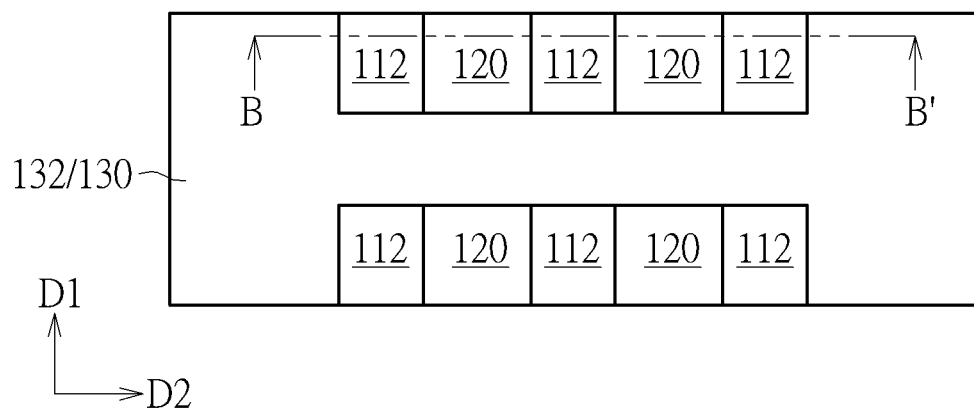

Please refer to FIGS. 1A-4B, which are schematic drawing illustrating a method for manufacturing an interconnect structure with air gaps provided by a first preferred embodiment of the present invention. Please refer to FIGS. 1A and 1B, wherein FIG. 1B is a cross-sectional view taken along a line B-B' of FIG. 1A. As shown in FIGS. 1A and 1B, the preferred embodiment provides a substrate 100, and an active circuit (not shown) is disposed in the substrate 100. It should be easily understood to those skilled in the art that the active circuit may include a plurality of metal-oxide-semiconductor (hereinafter abbreviated as MOS) transistors (not shown) or other devices. And a plurality of shallow trench isolations (STIs) (not shown) can be provided to isolate those devices. A first insulating layer 112 is formed on the substrate 100, and a plurality of conductive lines 120 are formed in the first insulating layer 112. According to one embodiment of the present invention, the first insulating layer 112 can be an interlayer-dielectric (ILD) layer, and the conductive lines 120 can be gate lines of the MOS transistors or conductive lines of other devices in the active circuit. Therefore the conductive lines 120 can include polysilicon or conductive material, but not limited to this. According to another embodiment of the present invention, the first insulating layer 112 can be an inter-metal dielectric (hereinafter abbreviated as IMD) layer, and the conductive line 120 can be the metal wires formed in the IMD layer. Therefore the conductive lines 120 can include conductive material such as copper, tungsten, aluminum or alloy of the abovementioned metals. Typically speaking, the metal wires are defined depending on where it is placed. For example, the metal wires are upwardly defined as a first metal layer M1, a second metal layer M2, . . . and so on to an nth metal layer Mn. The first insulating layer 112 used to electrically isolate the conductive lines 120 can include boro-phospho-silicate glass (BPSG), phosphor-silicate glass (PSG), tetra-ethylortho-silicate (TEOS), low-k dielectric material such as black Diamond® available from Applied Materials, Inc. of Santa Clara, Calif., fluorinated silica glass (FSG), porous low-k dielectric material, or self-assembled dielectric material, but not limited to this. As shown in FIG. 1A, the conductive lines 120 are extended along a first direction D1.

Figure 1B:
FIG. 1B is a cross-sectional view taken along a line B-B' of FIG. 1A.
Figure 1B:
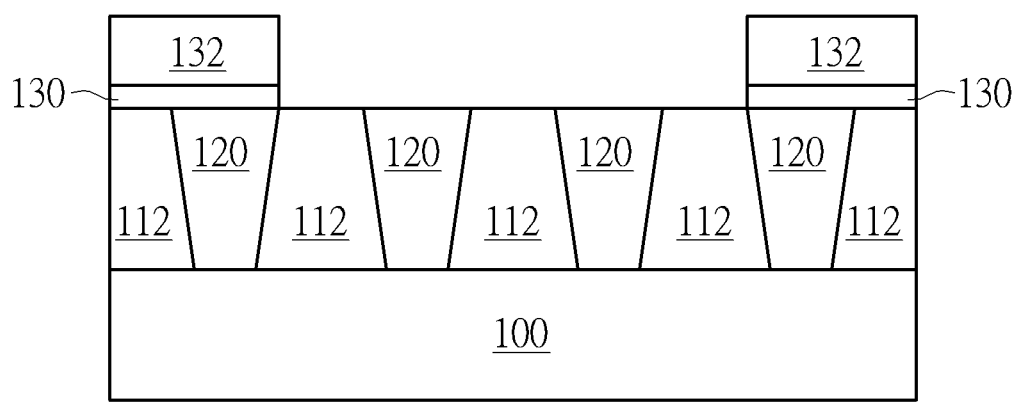

Please still refer to FIGS. 1A and 1B. Next, a hard mask layer is formed on the substrate 100, and followed by performing a photolithography process: A photoresist pattern 132 is used to pattern the hard mask layer and thus a patterned hard mask 130 is obtained as shown in FIGS. 1A and 1B. According to the preferred embodiment, the hard mask layer/the patterned hard mask 130 can include silicon carbonitride (hereinafter abbreviated as SiCN), silicon carbide (hereinafter abbreviated as SiC), or silicon oxynitride (hereinafter abbreviated as SiON), but not limited to this. Since the steps of the photolithography process and materials used in the photolithography process are all conventionally known to those skilled in the art, those details are omitted in the interest of brevity. It is noteworthy that the patterned hard mask 130 is extended along a second direction D2, and the second direction D2 is perpendicular to the first direction D1. As shown in FIG. 1A, the patterned hard mask 130 covers portions of the first insulating layer 112 and portions of the conductive lines 120. In other words, the patterned hard mask 130 exposes portions of the first insulating layer 112 and portions of the conductive lines 120.

Figure 2A:
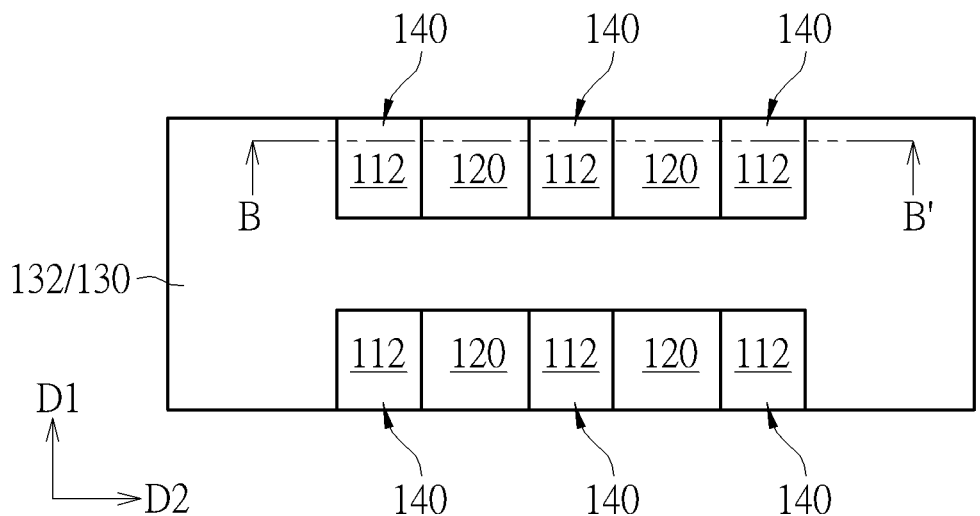
FIG. 2A is a schematic drawing in a step subsequent to FIG. 1A.
Figure 2B:
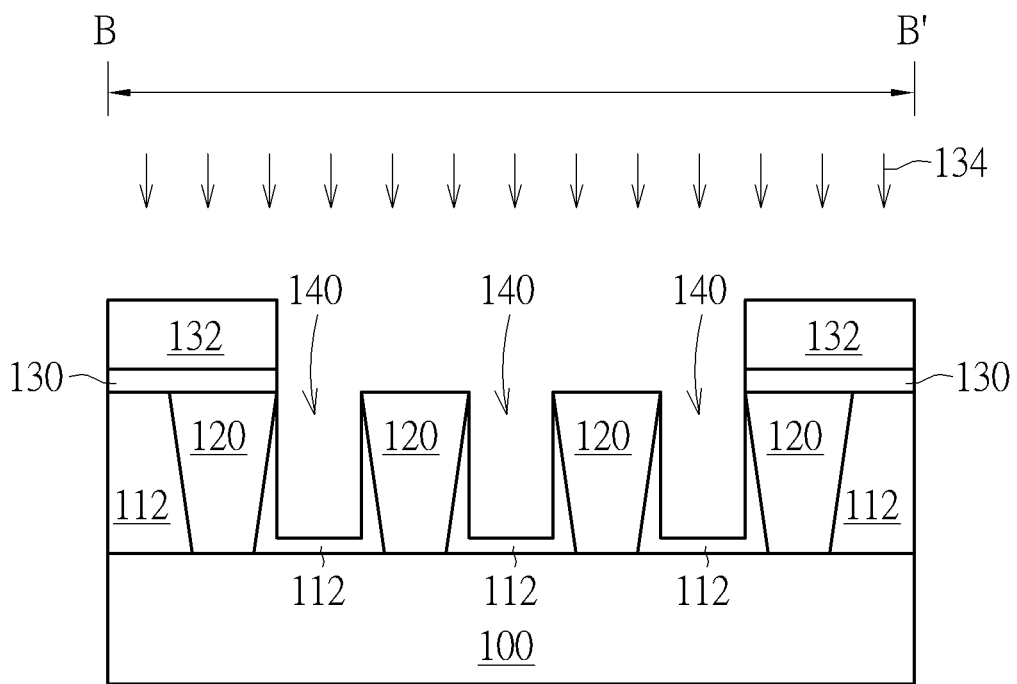
FIG. 2B is a cross-sectional view taken along a line B-B' of FIG. 2A.

Please refer to FIGS. 2A and 2B, wherein FIG. 2B is a cross-sectional view taken along a line B-B' of FIG. 2A. As shown in FIGS. 2A and 2B, an etching process 134 is performed to remove the exposed portions of first insulating layer 112, and thus a plurality of recesses 140 are formed in the first insulating layer 112. As shown in FIG. 2A, the recesses 140 include stripe shape. In detail, the etching process 134 is to remove the exposed portions of the first insulating layer 112 formed in two adjacent conductive lines 120, and thus the recesses 140 are obtained in two adjacent conductive lines 120 as shown in FIGS. 2A and 2B. It should be noted that the stripe-shaped recesses 140 are ended at where the patterned hard mask 130 and the photoresist pattern 132 are disposed. Preferably, the above mentioned etching process 134 is an etching process to which the conductive lines 120 are impervious. Furthermore, by adjusting process parameters of the etching process 134, the first insulating layer 112 in the recess 140 can be still remained on sidewalls and a bottom of the recesses 140 as shown in FIG. 2B. Alternatively, by adjusting process parameters of the etching process 134, the first insulating layer 112 in the recess 140 can be completely removed. After forming the recesses 140, the photoresist pattern 132 is removed.

Figure 3A:
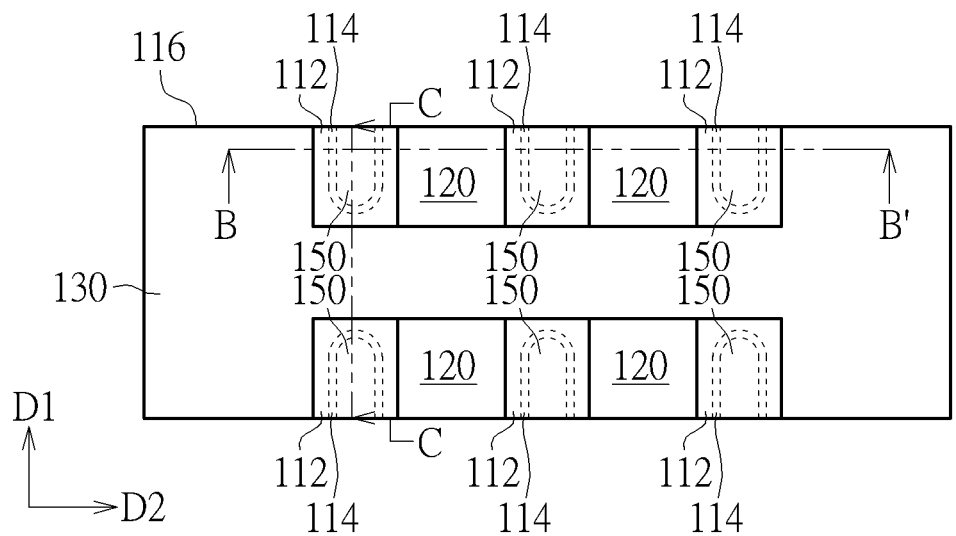
FIG. 3A is a schematic drawing in a step subsequent to FIG. 2A.
Figure 3B:
FIG. 3B is a cross-sectional view taken along a line B-B' of FIG. 3A.
Figure 3B:
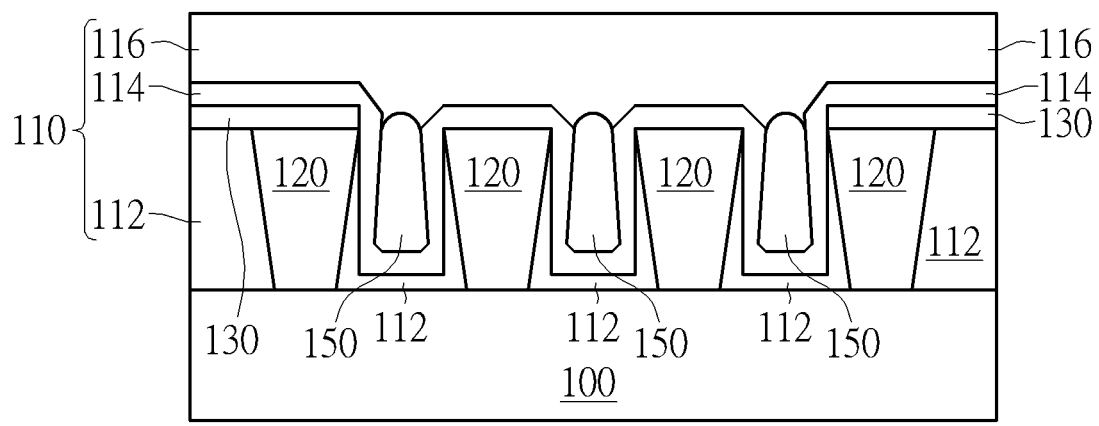
Figure 3B:
Figure 3C:
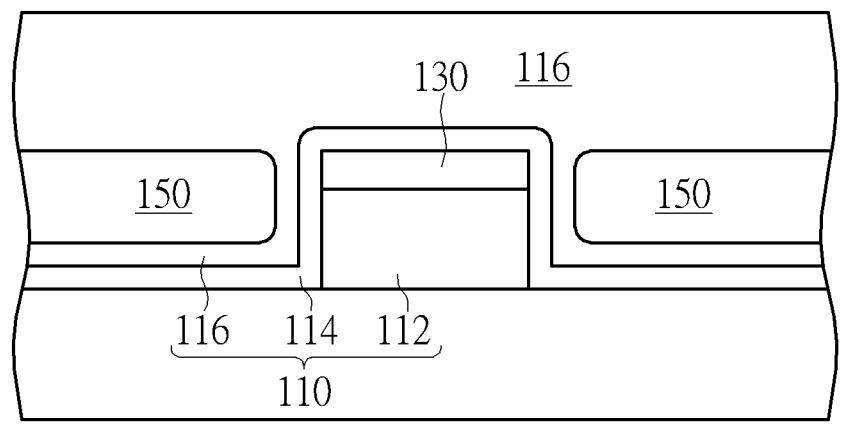
FIG. 3C is a cross-sectional view taken along a line C-C' of FIG. 3A.

Please refer to FIGS. 3A-3B, wherein FIG. 3B is a cross-sectional view taken along a line B-B' of FIG. 3A, and FIG. 3C is a cross-sectional view taken along a line C-C' of FIG. 3A. Next, a second insulating layer 114 is blanketly formed on the substrate 100, particularly on the first insulating layer 112, the recesses 140 and the patterned hard mask 130. The second insulating layer 114 covers surfaces of the recesses 140 and top surfaces of the patterned hard mask 130 as shown in FIGS. 3B and 3C. Furthermore, an etching rate of the second insulating layer 114 is preferably different from an etching rate of the first insulating layer 112. The second insulating layer 114 can include SiCN, SiC, or SiON, but not limited to this. As shown in FIG. 3B, an overhang is spontaneously formed on openings of the recesses 140. Consequently, opening width of each recess 140 is reduced.

Please still refer to FIGS. 3A-3C. After forming the second insulating layer 114, a third insulating layer 116 is formed on the substrate 100, particularly on the second insulating layer 114. An etching rate of the third insulating layer 116 is preferably different from the etching rate of the second insulating layer 114. It is noteworthy that the third insulating layer 116 further reduces the opening with of each recess 140, which has been already reduced by forming the second insulating layer 114. Consequently, the recesses 140 are sealed by the third insulating layer 116 and thus air gaps 150 are respectively formed in the recesses 140, as shown in FIGS. 3A-3C. In other words, the air gaps 150 are sealed within the third insulating layer 116. It is noteworthy that the air gaps 150 can be formed in between two adjacent conductive lines 120 and immediately adjacent to the conductive lines 120. In other words, two air gaps 150 are formed at two opposite sides of at least one conductive line 120 of the plurality of the conductive line 120. And the conductive lines 120 are physically and electrically isolated from the air gaps 150 by an insulating material 110 formed on the substrate 100. In one embodiment of the present invention, the insulating material 110 can upwardly and sequentially includes the first insulating layer 112, the second insulating layer 114, and the third insulating layer 116 as shown in FIGS. 3B and 3C. However, in other embodiments of the present invention, when the first insulating layer 112 not overlapped by the patterned mask 130 is completely removed, the insulating material 110 can upwardly and sequentially include the second insulating layer 114 and the third insulating layer 116. Briefly speaking, the air gaps 150 are formed within the insulating material 110 and physically and electrically isolated from the conductive lines 120 by the insulating material 110.

Figure 4A:
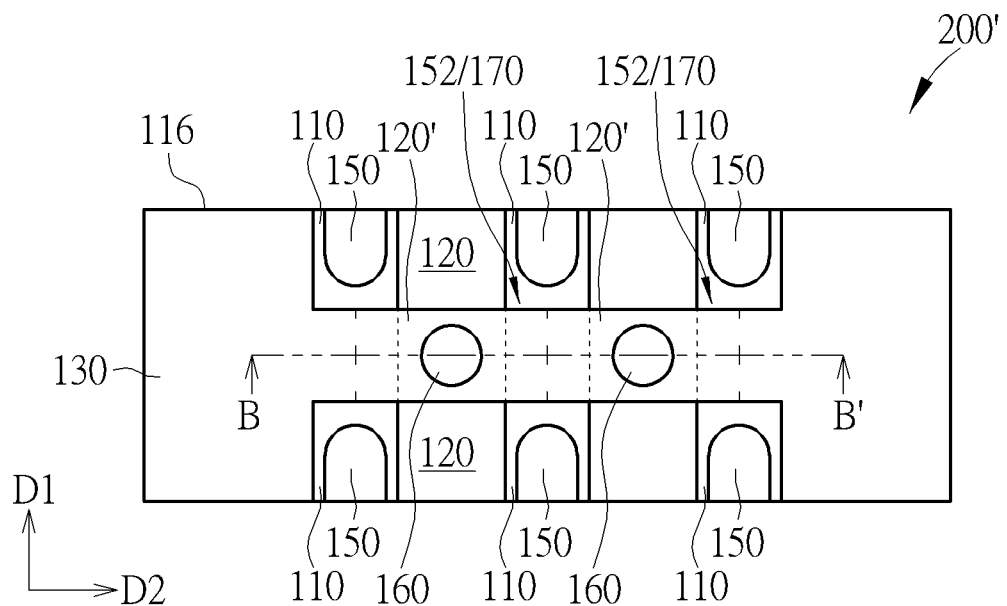
FIG. 4A is a schematic drawing in a step subsequent to FIG. 3A.
Figure 4B:
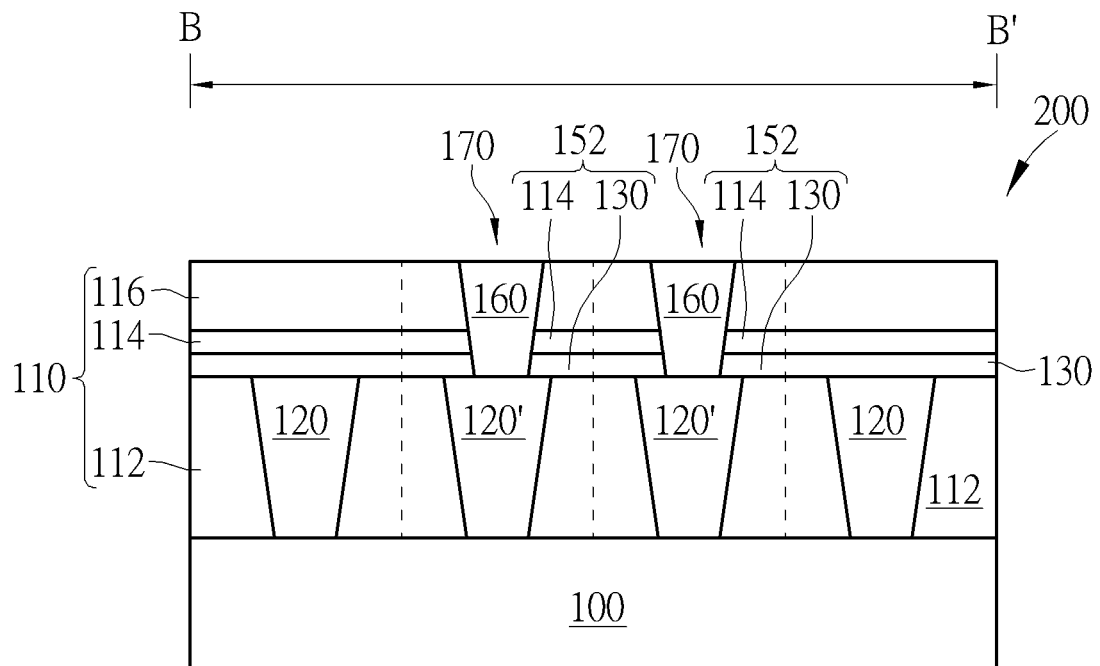

Please refer to FIGS. 4A and 4B, wherein FIG. 4B is a cross-sectional view taken along a line B-B' of FIG. 4A. As mentioned above, the conductive lines 120 are extended along the first direction D1 while the patterned hard mask 130 is extended along the second direction D2. Therefore the patterned hard mask 130 and the second insulating layer 114 cross the conductive lines 120, that is, portions of the patterned hard mask 130 and the second insulating layer 114 overlap the conductive lines 120 and overlap portions of the first insulating layer 112 at the sides of the conductive lines 120. This specific portions of the patterned hard mask 130 and the second insulating layer 114 serve as a landing mark 152, as shown in FIGS. 4A and 4B. Thereafter, some conductive lines are picked out for constructing electrical connection and thus defined as conductive lines 120' depending on different product requirements. And an openings (not shown) penetrating the patterned hard mask 130 and the second insulating layer 114 are formed on the landing mark 152 on the conductive lines 120'. Thus, the conductive lines 120' are exposed at bottoms of the openings. Next, a conductive layer is formed to fill the openings and followed by performing a planarization to remove superfluous materials. Thus, via structures 160 are formed on the conductive lines 120' as shown in FIGS. 4A and 4B. It should be well-known to those skilled in the art that before forming the conductive layer in the openings, other required layers such as barrier layer(s) can be formed. However, since those layer(s) is well-known to those skilled in the art, those details are omitted in the interest of brevity. As mentioned above, in some embodiments of the present invention, the conductive lines 120' can be the gate lines of MOS transistors or conducive wires of other devices, therefore the via structures 160 serve as gate contact plugs electrically connecting the gate lines to other devises. Or, the via structures 160 serve as contact plugs electrically connecting the given devices to other devises. Alternatively, in some embodiments of the present invention, the conductive line 120' can be metal wires in the IMD layer and thus the via structures 160 serve as via structures electrically connecting the nth conductive lines to the (n+1)th conductive lines.

Please refer to FIGS. 4A and 4B again. Consequently, the present invention provides an interconnect structure 200 with air gaps 150. The interconnect structure 200 with air gaps 150 includes the conductive line 120' formed in the insulating material 110, the landing mark 152 formed on the conductive lines 120', and the via structures 160 formed on the conductive lines 120'. The via structures 160 penetrate the landing marks 152 and thus are electrically connected the conductive lines 120', respectively. As shown in FIG. 4B, sidewalls of the via structures 160 contact the patterned hard mask 130, the second insulating layer 114, and the third insulating layer 116. Additionally, the insulating material 110 can include the first insulating layer 112, the second insulating layer 114, and the third insulating layer 116. In this case, the conductive lines 120' are physically and electrically isolated from the air gaps 150 by the first insulating layer 112, the second insulating layer 114 and the third insulating layer 116. In some embodiments of the present invention, the insulating material 110 can include merely the second insulating layer 114 and the third insulating layer 116, and thus the conductive lines 120' are physically and electrically isolated from the air gaps 150 by the second insulating layer 114 and the third insulating layer 116. More important, the "via structure 160—landing mark 152— conductive line 120'" structure serves as an interconnect unit 170. That is, any interconnect unit 170 includes the abovementioned conductive line 120', the landing mark 152 on the conductive line 120' and the via structure 160 on the landing mark 152. The via structure 160 penetrate the landing mark 152, and thus is electrically connected to the conductive line 120'. Also, as shown in FIG. 4A, the present invention provides an interconnect layout structure 200' with air gaps 150. The interconnect layout structure 200' includes a plurality of air gaps 150 extended along the first direction D1. The present invention further provides at least an interconnect unit 170 disposed in the interconnect layout structure 200', and the landing mark 152 of the interconnect unit 170 separates the air gaps 150. In detail, the landing mark 152 of the interconnect unit 170 is disposed in between two air gaps 150 arranged in a straight line, or arranged in a same column, as shown in FIG. 4A. In other words, the air gaps 150 arranged in the same column are physically separated from each other by the landing mark 152 of the interconnect unit 170. Furthermore, the interconnect layout structure 200' includes a plurality of insulating material patterns 110. It is noteworthy that the interconnect unit 170 can include the insulating material patterns 110 which is disposed at the two opposites sides of the conductive line 120'. More than that, the landing mark 152 of the interconnect unit 170 covers portions of the abovementioned insulating material patterns 110 as shown in FIG. 4B. According to the preferred embodiment, the air gaps 150 arranged in the straight line, or arranged in a same column, are physically spaced apart from each other by the landing mark 152 of the interconnect unit 170 and the underneath insulating material patterns 110. Consequently, the insulating material patterns 110 of the interconnect unit 170 contact the air gaps 150.

More important, the interconnect units 170 provided by the present invention can be inserted into or arranged in the interconnect layout structure 200' at where it is required. For example, in some embodiments of the present invention, the interconnect units 170 are arranged in the interconnect layout structure 200' along the second direction D2 and those interconnect units 170 are spaced apart from each other. Alternatively, those interconnect units 170 arranged in the interconnect layout structure 200' can contact each other, as shown in FIGS. 4A and 4B. Since the conductive lines 120 of the embodiment are all arranged along the first direction D1 and the interconnect units 170 are inserted in to the conductive lines 120 at where it is required, the conductive lines 120 are taken as disposed at two sides of the interconnect units 170, and the conductive lines 120 physically contact the conductive lines 120' in the interconnect units 170 while the insulating material patterns 110 are arranged at the other two sides of the conductive lines 120. More important, the landing marks 152 and the insulating material patterns 110 of the interconnect unit 170 separate the air gaps 150 arranged in the straight line, or arranged in a same column. It should be noted that though the conductive lines 120' of the interconnect units 170 and the conductive lines 120 are designated by different numerals, those skilled in the art should easily realize that the conductive lines 120' of the interconnect units 170 and the conductive lines 120 are simultaneously formed. In fact, the conductive lines 120' and the conductive lines 120 are the same elements, but the conductive lines 120' are picked out for building electrical connection and thus the via structure is formed on the conductive lines 120'.

As mentioned above, the interconnect structure 200 with air gaps 150 and the interconnect layout structure 200' with air gaps 150 include the interconnect unit(s) 170, and the interconnect unit(s) 170 is constructed by the conductive line 120' at where the via structure 160 is to be formed, the landing mark 152 formed on the conductive line 120', and the via structure 160 formed on the conductive line 120'. In any interconnect unit 170, there is insulating material 110 disposed on the two opposite sides of the conductive line 120'. Consequently, the insulating material 110 disposed at the two opposite sides of the conductive line 120' provides sufficient mechanical strength while the air gaps 150 provide electrical isolation, and thus parasitic capacitance is still reduced.

Figure 5A:
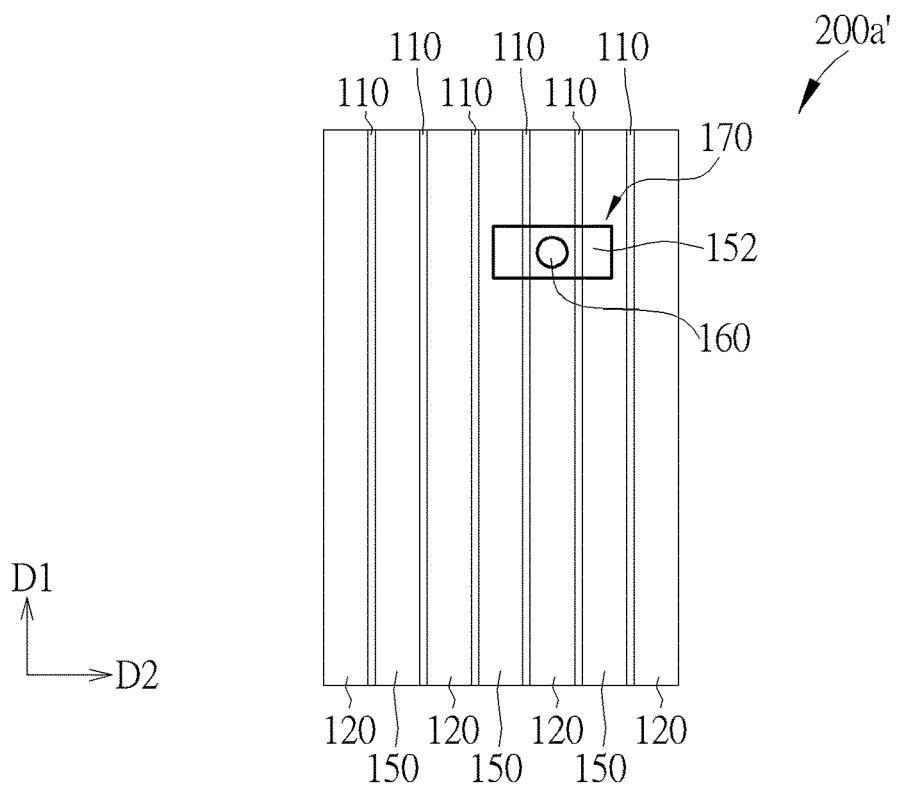
FIGS. 5A-5B are schematic drawings respectively illustrating an interconnect layout structure with air gaps and an interconnect structure with air gaps provided by a second preferred embodiment of the present invention.
Figure 5B:
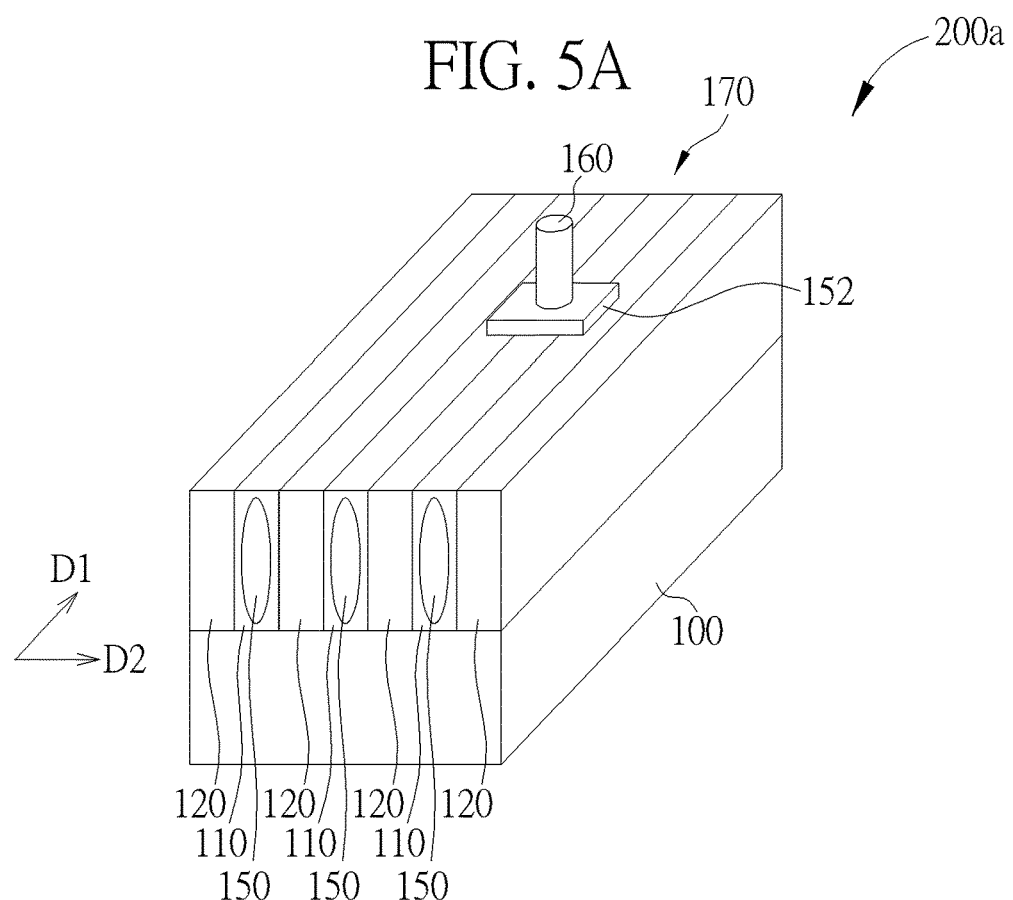

Please refer to FIGS. 5A and 5B, are schematic drawings respectively illustrating an interconnect layout structure with air gaps and an interconnect structure with air gaps provided by a second preferred embodiment of the present invention. It should be noted that elements the same in both of the first and second preferred embodiments can be formed by the same processes and steps, and are designated by the same numerals, thus those details are omitted in the interest of brevity. It is noteworthy that for clarifying the spatial relationship between the interconnect unit 170 and other elements, the third insulating layer 116 is omitted from FIGS. 5A and 5B. However, those skilled in the art would easily realize placements of those omitted elements such as the third insulating layer 116 according to the abovementioned embodiment. Accordingly, the preferred embodiment provides an interconnect structure 200a and an interconnect layout structure 200a'. As mentioned above, the interconnect unit 170 provided by the present invention can be inserted to and arranged in the interconnect structure 200a and the interconnect layout structure 200a' at where it is required. According to the preferred embodiment, at least one single interconnect unit 170 is inserted into the interconnect structure 200a and the interconnect layout structure 200a'. However, a plurality of interconnect units 170 can be inserted into the interconnect structure 200a and the interconnect layout structure 200a' for constructing electrical connections if required. Therefore, FIGS. 5A and 5B serve as exemplary drawings, but not limited to this. As shown in FIGS. 5A and 5B, the interconnect unit 170 can be independently placed in the interconnect layout structure 200a' and the interconnect structure 200a. According to the embodiment, the insulating material patterns 110 are formed at the two sides of the conductive line 120' of the interconnect unit 170 for providing sufficient mechanical strength. It is also noteworthy that the interconnect unit 170 is inserted into the stripe-shaped the conductive lines 120, and thus the landing mark 152 and the insulating material patterns 110 of the interconnect unit 170 separate the air gaps 150 arranged in the straight lines, or arranged in same columns. However, the stripe shape of the air gaps 150 still remains. More important, the interconnect unit 170, which separates the air gaps 150, is inserted into the interconnect layout structure 200a' and the interconnect structure 200a at where it is required, and thus the parasitic capacitance and RC delay of the interconnect structure 200a are reduced by the air gaps 150 while the mechanical strength is improved by the insulating material patterns 110.

Figure 6A:
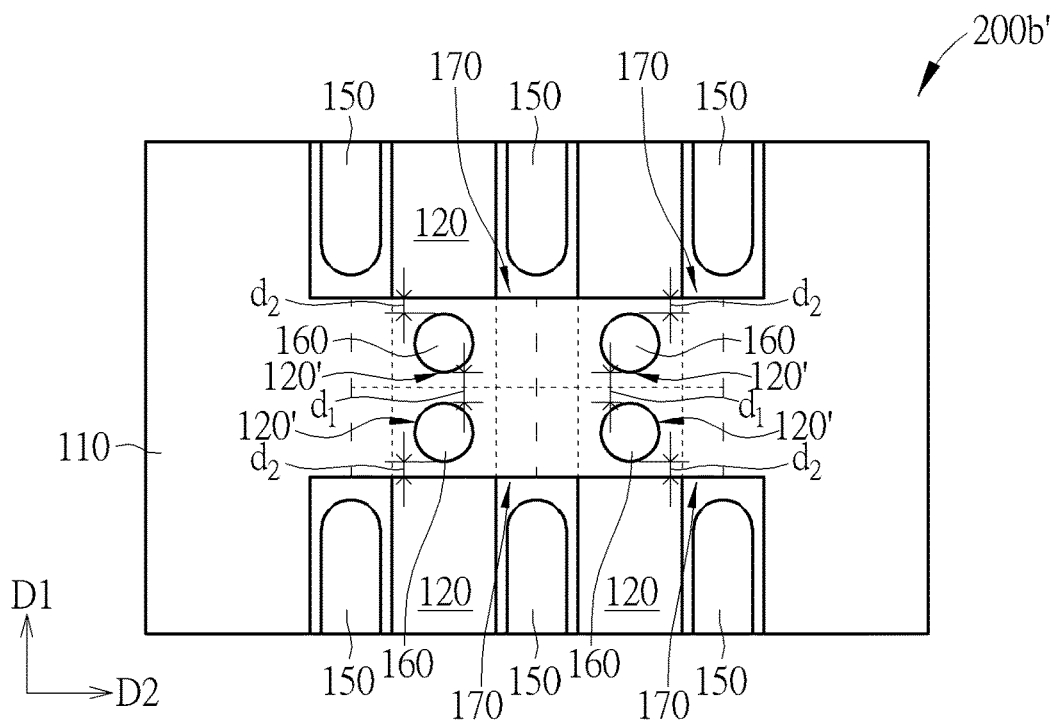
FIGS. 6A-6B are schematic drawings respectively illustrating an interconnect layout structure with air gaps and an interconnect structure with air gaps provided by a third preferred embodiment of the present invention.
Figure 6B:
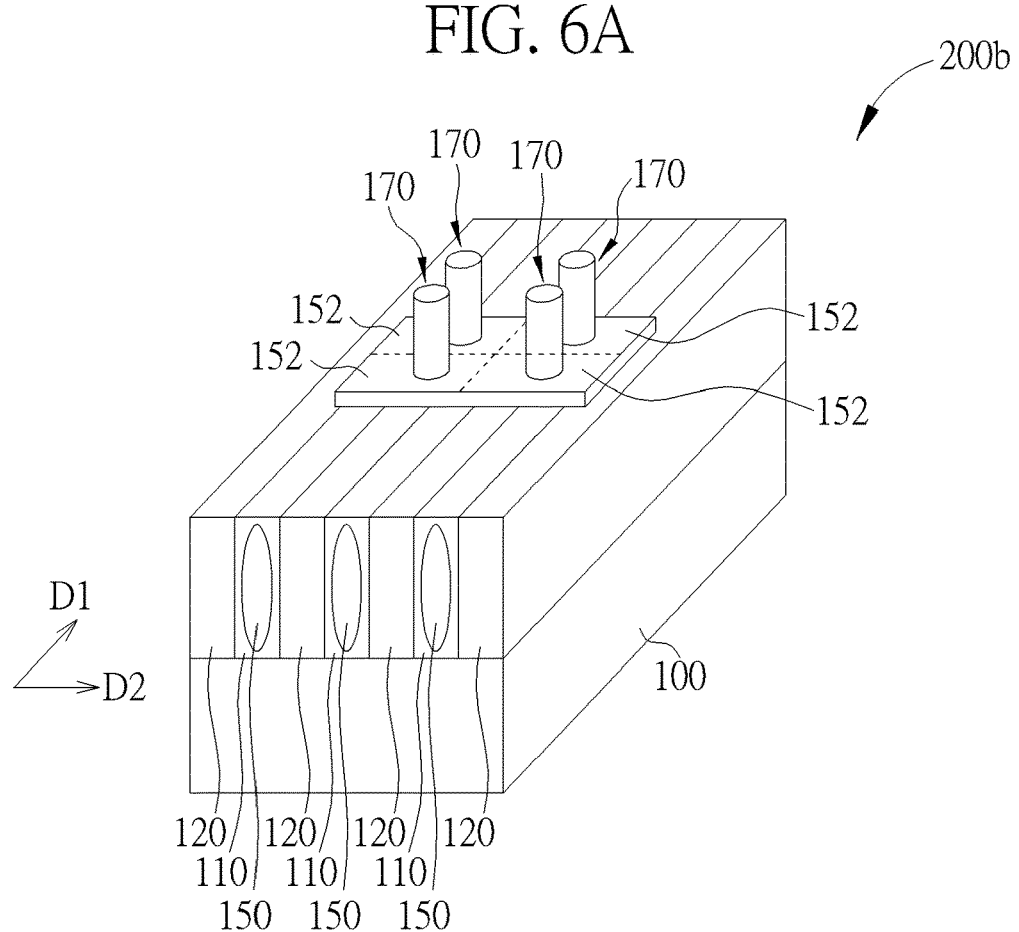

Please refer to FIGS. 6A and 6B, are schematic drawings respectively illustrating an interconnect layout structure with air gaps and an interconnect structure with air gaps provided by a third preferred embodiment of the present invention. It should be noted that elements the same in the instant and previous preferred embodiments can be formed by the same processes and steps, and are designated by the same numerals, thus those details are omitted in the interest of brevity. It is noteworthy that for clarifying the spatial relationship between the interconnect unit 170 and other elements, the third insulating layer 116 is omitted from FIGS. 6A and 6B. Accordingly, the preferred embodiment provides an interconnect structure 200b and an interconnect layout structure 200b'. As mentioned above, the interconnect unit 170 provided by the present invention can be inserted to and arranged in the interconnect structure 200b and the interconnect layout structure 200b' at where it is required. According to the preferred embodiment, a plurality of interconnect units 170 are inserted into the interconnect structure 200b and the interconnect layout structure 200b'. Moreover, those interconnect units 170 contact each other. As shown in FIGS. 6A and 6B, according to the embodiment, the insulating material patterns 110 are formed at the opposite two sides of the conductive line 120' while the conductive line 120 is formed at least one side of the conductive line 120'. Accordingly, the insulating material patterns 110 at the opposite two sides of the conductive line 120' provide mechanical strength. It is noteworthy that though the interconnect units 170 are inserted into interconnect structure 200b/the interconnect layout structure 200b' and the landing marks 152 of the interconnect units 170 separate the air gaps 150 arranged in a same column, the stripe shape of the air gaps 150 still remains. More important, the interconnect units 170, which separate the air gaps 150, are grouped together and inserted into the interconnect layout structure 200b' and the interconnect structure 200b at where it is required, and thus the parasitic capacitance and RC delay of the interconnect structure 200b are reduced by the air gaps 150 while the mechanical strength is improved by the insulating material patterns 110. Furthermore, when the interconnect units 170 are grouped and inserted into the interconnect layout structure 200b'/the interconnect structure 200b, the two via structures 160 include a first distance d1 defined therebetween 160, and the via structure 160 and a long side of the landing mark 152 include a second distance d2 defined therebetween. In some embodiments of the present invention, the first distance d1 is equal to the second distance d2. In other embodiments of the present invention, the first distance d1 is preferably smaller than the second distance d2, and thus process window of the via formation is improved.

Figure 7A:
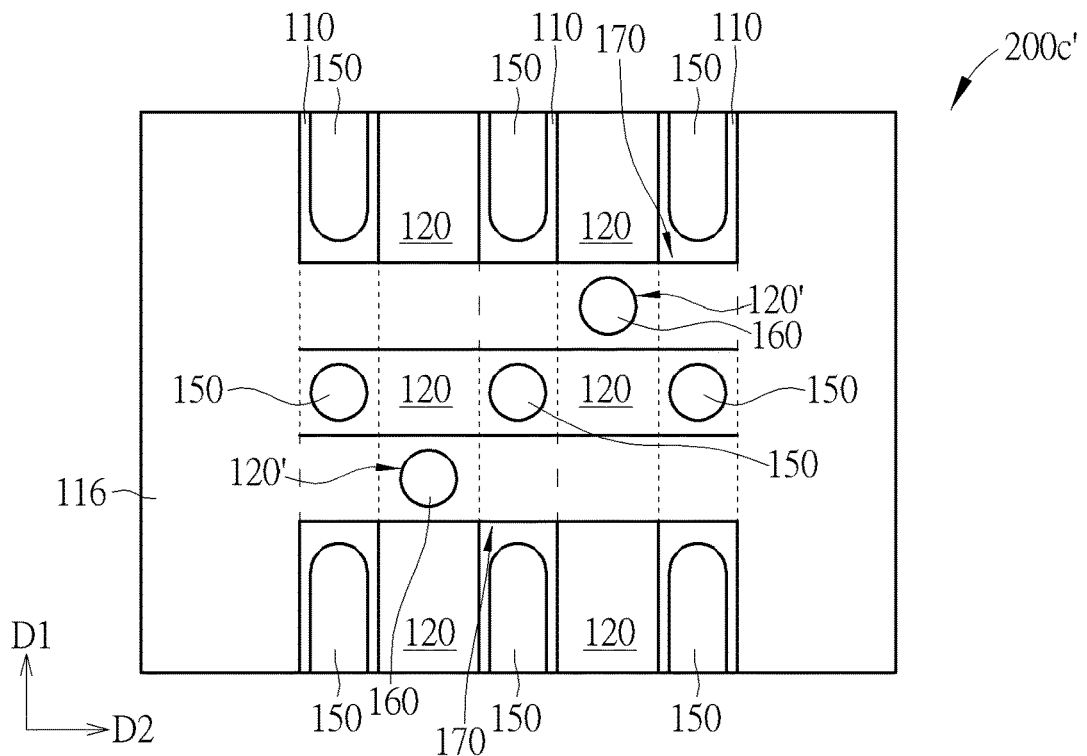
FIGS. 7A-7B are schematic drawings respectively illustrating an interconnect layout structure with air gaps and an interconnect structure with air gaps provided by a fourth preferred embodiment of the present invention.
Figure 7B:
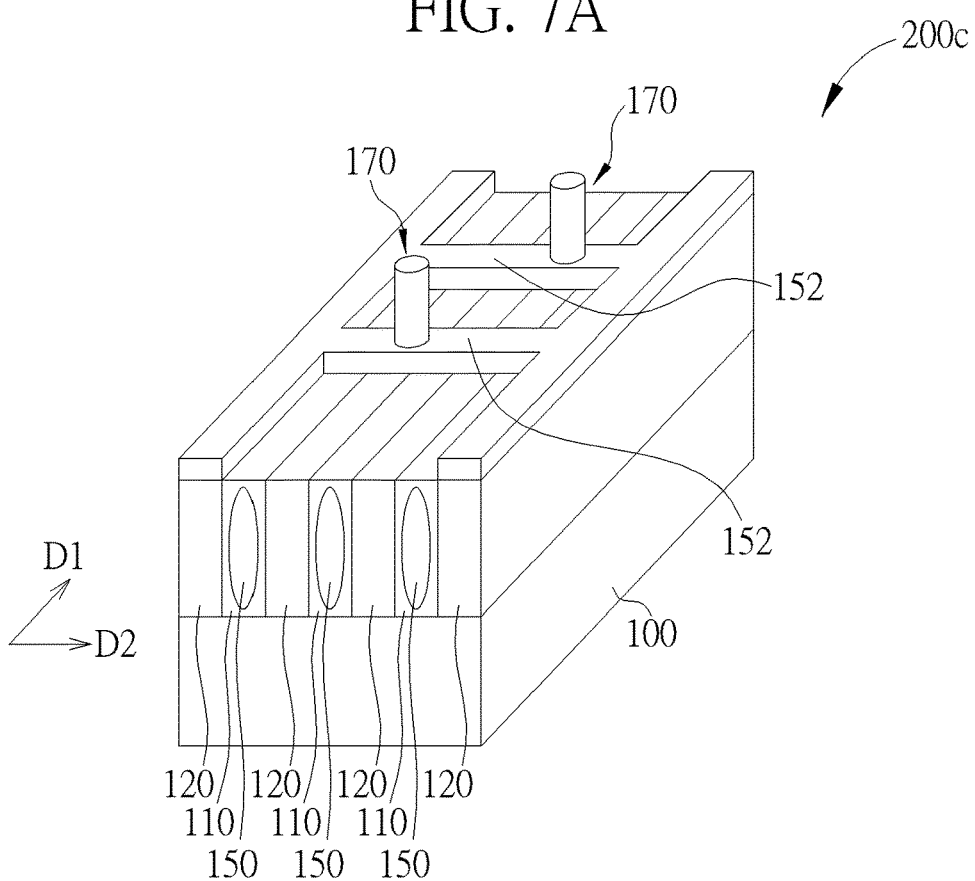

Please refer to FIGS. 7A and 7B, which are schematic drawings respectively illustrating an interconnect layout structure and an interconnect structure provided by a fourth preferred embodiment of the present invention. It should be noted that elements the same in the instant and previous preferred embodiments can be formed by the same processes and steps, and are designated by the same numerals, thus those details are omitted in the interest of brevity. It is noteworthy that for clarifying the spatial relationship between the interconnect unit 170 and other elements, the third insulating layer 116 is omitted from FIGS. 7A and 7B. However, those skilled in the art would easily realize placements of those omitted elements such as the third insulating layer 116 according to the abovementioned embodiment. Accordingly, the preferred embodiment provides an interconnect structure 200c and an interconnect layout structure 200c'. As mentioned above, the interconnect unit 170 provided by the present invention can be inserted to and arranged in the interconnect structure 200c and the interconnect layout structure 200c' at where it is required. According to the preferred embodiment, a plurality of interconnect units 170 are inserted into the interconnect structure 200c and the interconnect layout structure 200c, and those interconnect units 170 are spaced apart from each other. As shown in FIGS. 7A and 7B, according to the embodiment, the insulating material patterns 110 are formed at the opposite two sides of each conductive line 120'. Accordingly, the insulating material patterns 110 at the opposite two sides of the conductive lines 120' provide mechanical strength. It is noteworthy that the landing marks 152 of the interconnect units 170 are extended along the second direction D2, and covers portions of conductive lines 120 where no via structures are to be formed (In other words, long sides of the landing mark 152 is perpendicular to the first direction D1). According to abovementioned method, the landing mark 152 (including the second insulating layer 114) and the underneath patterned hard mask 130 and first insulating layer 112 all work together to improve mechanical strength for the conductive lines 120 even though no via structures are to be formed thereon. Furthermore, the air gaps 150 in the interconnect layout structure 200c' and the interconnect structure 200c still provide electrical isolation, and thus parasitic capacitance is reduced.

Figure 8A:
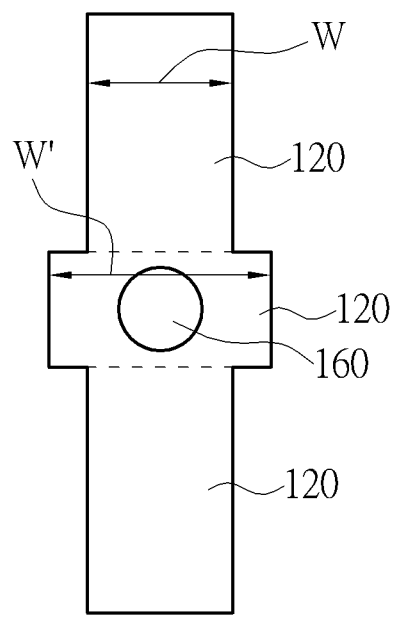
FIGS. 8A-8C are schematic drawings illustrating an interconnect layout structure with air gaps provided by a fifth preferred embodiment of the present invention.
Figure 8B:
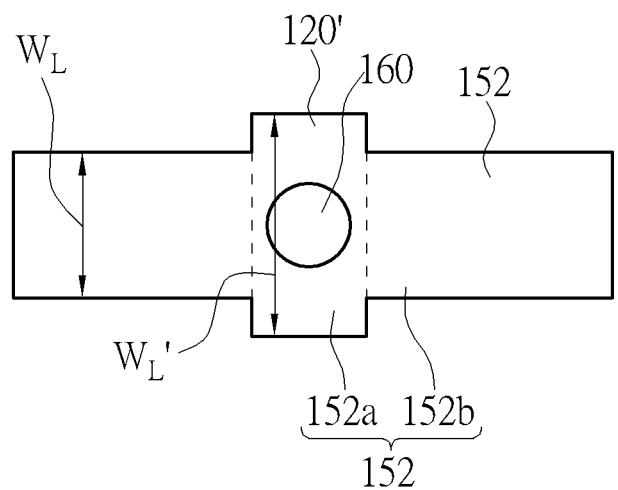
Figure 8C:
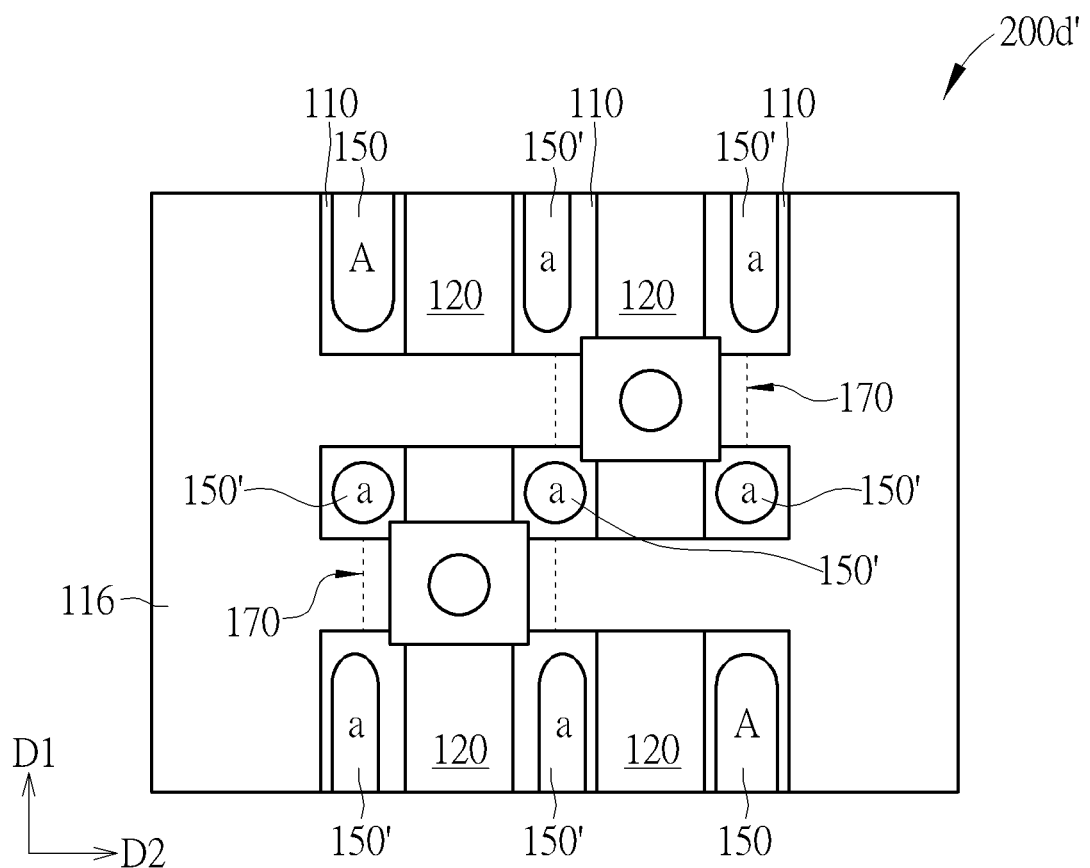

Please refer to FIGS. 8A-8C, which are schematic drawings illustrating an interconnect layout structure provided by a fifth preferred embodiment of the present invention. It should be noted that elements the same in the instant and previous preferred embodiments can be formed by the same processes and steps, and are designated by the same numerals, thus those details are omitted in the interest of brevity. It is noteworthy that for clarifying the spatial relationship between the interconnect unit 170 and other elements, the third insulating layer 116 is omitted from FIGS. 8A-8C. However, those skilled in the art would easily realize placements of those omitted elements such as the third insulating layer 116 according to the abovementioned embodiment. Accordingly, the preferred embodiment provides an interconnect structure 200d and an interconnect layout structure 200d'. In the preferred embodiment, a width W' of the conductive lines 120' is larger than a width W of the conductive line 120 physically connected to the conductive lines 120', as shown in FIG. 8A. Furthermore, according to the preferred embodiment, the landing mark 152 is divided into a first portion 15A which overlaps the conductive line 120' and a second portion 152B which does not overlap the conductive line 120'. More important, a width WL' of the first portion 152A is larger than a width WL of the second portion 152B as shown in FIG. 8B. Consequently, sufficient protection rendered from the landing mark 152 to the conductive line 120' which includes the larger width W' is ensured.

Please refer to FIG. 8C. AS mentioned above, the interconnect units 170 provided by the present invention can be inserted to and arranged in the interconnect layout structure 200d' at where it is required. According to the preferred embodiment, a plurality of interconnect units 170 are inserted into the interconnect layout structure 200d', and those interconnect units 170 can be formed to contact each other or, alternatively, separately formed as shown in FIG. 8C. It is noteworthy that since the landing mark 152 of the interconnect unit 170 and the insulating material 110 physically separate the air gaps 150 arranged in the same column, the air gaps immediately adjacent to the landing mark 152 are recognized as air gaps 150'. Furthermore, it can be found that the width W' of the conductive line 120' is larger the width W the conductive lines 120, and the width WL' of the first portion 152A of the landing mark 152 is larger than the width WL of the second portion 152B of the landing mark 152, therefore a size "a" of the air gaps 150' immediately adjacent to the landing mark 152 is smaller than a size "A" of the air gaps 150 which are not immediately adjacent to the landing mark 152. According to the preferred embodiment, the conductive lines 120' with the larger width W' is provided to improve process window, the insulating material patterns 110 at two opposite side of the conductive line 120' is provided to improve mechanical strength. It is also noteworthy that although the landing marks 152 and the insulating material patterns 110 of the interconnect unit 170 are inserted to separate the air gaps 150' arranged in the straight line and thus the size "a" of the air gaps 150' is reduced as shown in FIG. 8C, the stripe shape of the air gaps 150 still remains. More important, since the interconnect unit 170 is inserted at where it is required, the parasitic capacitance and RC delay of the interconnect structure 200d still can be reduced by the air gaps 150/150'.

According to the interconnect structure with air gaps, the interconnect layout structure with air gaps, and manufacturing method thereof provided by the present invention, at least an interconnect unit made of "conductive line-landing mark (the insulating material)-via structure" is provided. The interconnect unit is integrated in the interconnect structure and/or the interconnect layout structure depending on different product requirements while the landing mark of the interconnect unit physically separates the air gaps arranged in the same straight line from each other. In other words, the interconnect structure with air gaps and the interconnect layout structure with air gaps obtained from performing the method for manufacturing the interconnect structure with air gaps is to insert the interconnect unit (s) to obtain sufficient mechanical strength from the landing mark (and the insulating material). Consequently, the mechanical strength of the whole interconnect structure is improved. Furthermore, it is well-known to those skilled in the art that in the conventional process, the via structure is made far from the air gaps and thus it suffers inferior reliability because the air gaps provide insufficient mechanical strength. Moreover, since the via structure is made far from the air gaps, the process in prior art suffers complicated routing design. Different from the prior art, since the interconnect unit can be introduced into the interconnect structure at where it is required, and the interconnect unit is formed to immediately adjacent to the air gaps, the present invention further simplifies routing design for the interconnect structure. It is also noteworthy that the interconnect unit provided by the present invention can be a dummy interconnect unit: the interconnect unit is physically and electrically isolated from the conductive lines. Therefore, the dummy interconnect unit is inserted only for improving mechanical strength without involving the construction of electrical connection. Briefly speaking, the present invention provides interconnect unit(s) with modularity to improve mechanical strength of the whole interconnect structure while RC delay of the interconnect structure is simultaneously reduced by the air gaps. Furthermore, the interconnect unit/dummy interconnect unit can be inserted into and arranged in the interconnect structure/the interconnect layout structure at where it is required, and thus process/product flexibility is further improved by the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing an interconnect structure with air gaps, comprising:
   providing a substrate comprising a first insulating layer formed thereon, and the first insulating layer comprising a plurality of conductive lines formed therein;
   forming a patterned hard mask on the first insulating layer and the conductive lines, and the patterned hard mask exposing portions of the first insulating layer and portions of the conductive line;
   removing the exposed portions of the first insulating layer to form a plurality of recesses in the first insulating layer;
   forming a second insulating layer and a third insulating layer in the recesses to seal the recesses and to form a plurality of air gaps respectively in the recesses, wherein the air gaps are sealed by the second insulating layer and the third insulating layer and at least two air gaps are respectively formed at two sides of one conductive line of the plurality of conductive lines, wherein the second insulating layer directly covers top surfaces of the portions of the conductive lines that are exposed from the patterned hard mask; and
   forming a via structure on the one conductive line.

2. The method for manufacturing the interconnect structure with air gaps according to claim 1, wherein the conductive lines are extended along a first direction, the patterned hard mask are extended along a second direction, and the first direction and the second direction are perpendicular to each other.

3. The method for manufacturing the interconnect structure with air gaps according to claim 1, wherein the step of forming the second insulating layer and the third insulating layer in the recesses further comprising:
   blanketly forming the second insulating layer on the substrate, and the second insulating layer covering the patterned hard mask, surfaces of the recesses and the top surfaces of the portions of the conductive lines that are exposed from the patterned hard mask; and
   forming the third insulating layer on the second insulating layer to seal the air gaps between the second insulating layer and the third insulating layer.

4. The method for manufacturing the interconnect structure with air gaps according to claim 3, wherein the step of forming the via structure on the one conductive line of the plurality of conductive lines further comprises:
   forming at least an opening penetrating the patterned hard mask and the second insulating layer on the conductive lines; and
   forming a conductive layer in the opening to form the via structure.

* * * * *